(12) United States Patent
Kalevo (10) Patent No.: US 8,933,826 B2
(45) Date of Patent: Jan. 13, 2015

(54) ENCODER APPARATUS, DECODER APPARATUS AND METHOD

(71) Applicant: Gurulogic Microsystems Oy, Turku (FI)

(72) Inventor: Ossi Kalevo, Akaa (FI)

(73) Assignee: Gurulogic Microsystems Oy, Turku (FI)

( * ) Notice: Subject to any disclaimer, the term of this patent is extended or adjusted under 35 U.S.C. 154(b) by 0 days.

(21) Appl. No.: 14/254,102

(22) Filed: Apr. 16, 2014

(65) Prior Publication Data

US 2014/0247167 A1    Sep. 4, 2014

Related U.S. Application Data (63) Continuation-in-part of application No. PCT/EP2014/000529, filed on Mar. 1, 2014, and a continuation of application No. PCT/EP2014/000531, filed on Mar. 1, 2014, and a continuation-in-part of application No. 13/782,757, filed on Mar. 1, 2013, now Pat. No. 8,754,791.

(30) Foreign Application Priority Data

Mar. 1, 2013  (GB) .................................. 1303658.7
Mar. 1, 2014  (GB) .................................. 1403641.2

(51) Int. Cl.
| | | |
|---|---|---|
| H03M 5/00 | (2006.01) | |
| H03M 7/30 | (2006.01) | |
| H03M 7/00 | (2006.01) | |
| G11B 20/14 | (2006.01) | |
| H03M 7/40 | (2006.01) | |
| G06K 9/38 | (2006.01) | |
| G06F 7/24 | (2006.01) | |
| G06T 1/20 | (2006.01) | |

(52) U.S. Cl.
CPC .............. *H03M 7/30* (2013.01); *G11B 20/1419* (2013.01); *H03M 7/4006* (2013.01); *G06K 9/38* (2013.01); *G06F 7/24* (2013.01); *G06T 1/20* (2013.01); *H03M 7/00* (2013.01)
USPC .............................................. 341/52; 341/50

(58) Field of Classification Search
CPC .. G11B 20/1419; H03M 7/30; H03M 7/4006; H04N 7/50; H04N 7/26106; G06K 9/38; G06T 1/20; G06F 7/24
USPC ........................ 341/52, 51, 50, 107; 712/300; 375/240.1, 240.26, 240.12, 240.18; 382/246, 232, 237, 303
See application file for complete search history.

(56) References Cited

U.S. PATENT DOCUMENTS 5,471,207 A    11/1995 Zandi et al.
7,711,938 B2 *  5/2010 Wise et al. ..................... 712/300
(Continued)

FOREIGN PATENT DOCUMENTS

EP          0 409 602 A2    1/1991
EP          2131501 A1     12/2009
(Continued)

OTHER PUBLICATIONS

UKIPO Combined Search and Examination Report under Sections 17 and 18(3) dated Sep. 2, 2014 which was issued in a related British Patent Application No. GB1403641.2 (6pages).

(Continued)

*Primary Examiner* — Joseph Lauture
(74) *Attorney, Agent, or Firm* — Lucas & Mercanti LLP; Robert P. Michal (57) ABSTRACT

An encoder encodes data to generate corresponding encoded data. The encoder includes a data processing arrangement for applying one or more encoding processes to the data to generate the encoded data. The data processing arrangement is operable to represent the data at least partially in a set of numerical value symbols, if the data is not already expressed in numerical value symbols. The data processing arrangement is operable to generate intermediate data in which the numerical value symbols are represented by original values and at least one symbol by a modified value with one or more continuum symbols generated by a continuum operator. The one or more continuum symbols modify preceding symbol values to accommodate an extended range of symbols.

32 Claims, 1 Drawing Sheet

(56) References Cited

U.S. PATENT DOCUMENTS

| | | |
|---|---|---|
| 2002/0193668 A1 | 12/2002 | Munneke et al. |
| 2005/0058205 A1 | 3/2005 | Holcomb et al. |

FOREIGN PATENT DOCUMENTS

| | | |
|---|---|---|
| GB | 2 301 252 A | 11/1996 |
| GB | 2301252 A | 11/1996 |
| WO | WO 2010/050157 A1 | 5/2010 |
| WO | WO 2012/147010 A1 | 11/2012 |

OTHER PUBLICATIONS

Combined Search and Examination Report Under Sections 17 and 18(3) dated Aug. 22, 2013, issued by UKIPO in related U.K. Patent Application No. GB1303658.7 (6 pages).

Notice of Allowance dated Mar. 14, 2014, issued by USPTO in U.S. Appl. No. 13/782,757 (8 pages).

Notification of Transmittal of the International Search Report and the Written Opinion, PCT International Search Report and Written Opinion mailed Jul. 8, 2014, which was issud by the International Searching Authority in a related PCT Application No. PCT/EP2014/000529 filed Mar. 1, 2014 (10 pages).

Held G, "Data Compression; Techniques and Applications; Hardware and Software Considerations", Jan. 1, 1983, J. Wiley & Sons, pp. 18-40; XP-002252154.

Notification of Transmittal of the International Search Report and the Written Opinion, PCT International Search Report and Written Opinion mailed Jun. 12, 2014, which was issued by ISA/EP in a related PCT application No. PCT/EP2014/000531 filed Mar. 1, 2014 (12 pages).

Wikipedia, "Run-length encoding",. URL: http://en.wikipedia.org/wiki/Run-length_encoding, Printed on May 6, 2014 (3 pages).

Wikipedia. "Shannon's source coding theorem", URL: http://en.wikipedia.org/wiki/Source_coding_theorem, Printed on May 6, 2014 (5 pages).

Shannon, Claude E., "A Mathematical Theory of Communication," The Bell System Technical Journal, vol. 27, pp. 379-423 & 623-656 Jul., Oct. 1948, Reprinted with corrections. URL: http://cm.bell-labs.com/cm/ms/what/shannonday/shannon1948.pdf (55 pages).

Wikipedia, "Entropy", URL: http://en.wikipedia.org/wiki/Entropy, Printed on May 6, 2014 (25 pages).

Wikipedia, "Arithmetic coding", URL: http://en.wikipedia.org/wiki/Arithmetic_coding. Printed on May 6, 2014 (14 pages).

Wikipedia, "Range encoding", URL: http://en.wikipedia.org/wiki/Range_encoding, Printed on May 6, 2014 (7 pages).

Wikipedia, "Variable-length code", URL: http://en.wikipedia.org/wiki/Variable-length_code, Printed on May 6, 2014 (4 pages).

Wikipedia, "Delta encoding", URL: http://en.wikipedia.org/wiki/Delta_coding, Printed on May 6, 2014 (5 pages).

Wikipedia, "RGB color model", URL: http://en.wikipedia.org/wiki/RGB_color_model, Printed on May 6, 2014 (12 pages).

Wikipedia, "YUV", URL: http://en.wikipedia.org/wiki/YUV, Printed on May 6, 2014 (10 pages).

* cited by examiner

ENCODER APPARATUS, DECODER APPARATUS AND METHOD

CROSS REFERENCE TO RELATED APPLICATION

This application is a Continuation-in-part of U.S. patent application Ser. No. 13/782,757, filed Mar. 1, 2013, and a Continuation-in-part of PCT International Application No. PCT/EP2014/000529, filed Mar. 1, 2014, both of which in turn claim the benefit of UK Patent Application No. 1303658.7, filed on Mar. 1, 2013. This application is also a Continuation of PCT/EP2014/000531, filed Mar. 1, 2014 and claims the benefit of UK Patent Application No, 1403641.2, filed Mar. 1, 2014. The entire disclosure of each of the above-identified applications is incorporated herein by reference.

TECHNICAL FIELD

The present disclosure relates to encoder apparatus for encoding data received thereat to generate corresponding encoded data. Moreover, the present disclosure also concerns methods of encoding data to generate corresponding encoded data. Furthermore, the present disclosure relates to decoder apparatus for decoding encoded data received thereat to generate corresponding decoded data. Additionally, the present disclosure relates to methods of decoding encoded data to generate corresponding decoded data. The present disclosure also relates to codecs including one or more aforesaid encoder apparatus in combination with one or more aforesaid decoder apparatus. Additionally, the present disclosure relates to software products recorded on non-transitory (non-transient) machine-readable data storage media, wherein the software products are executable upon computing hardware for executing aforementioned methods.

BACKGROUND INFORMATION

In overview, contemporary data communication networks and data processing apparatus are required to handle increasingly larger volumes of data. Such handling of data correspondingly requires more data communication bandwidth and/or more data storage capacity. Such bandwidth and/or storage capacity is costly to provide. Thus, there is a considerable benefit that is derivable from compressing data when communicating and/or storing the data.

Contemporary information is often represented in a form of data, for example audio, image, video, graphics, ECG, seismic, measurement data, numbers, excel charts, characters, text, news, ASCII characters, Unicode characters, binary data, commercials, multidimensional data. Moreover, such data is expressible in different formats such as bits, bytes, words, characters, numbers, figures and so forth. Moreover, contemporary information is encodable by employing potentially a multitude of different encoding methods which have been developed in recent decades. As aforementioned, it is most often necessary to store and/or transmit information, and thus it is beneficial that the information can be expressed with as small amount of encoded data, for example entropy coded data and additional information, as possible, for example as regards the data size in bits.

When considering methods of encoding data, it is convenient to consider each individual piece of information as an element or a symbol. Such representation of the pieces of information as elements or symbols allows an entropy for the information to be calculated, for example using Shannon entropy computation, see references [2], [3] and [4]; such computation can be executed for various different kinds of symbol representations before and after a multitude of different algorithms, for example entropy coding algorithms and/or entropy modifying algorithms. For example, the individual symbols can be entropy-encoded using multiple different entropy encoding methods. Moreover, symbols can also be converted from one form to another form, for example numbers can be converted to text, text can be converted to words, and bits can be converted to bytes.

Examples of an individual symbol include, for example, a bit value (1, 6, 8, 10, ... bit), a byte value (8-bit), a word value (16, 32, 64, 128, ... -bit), a (ASCII. Unicode, Chinese, Arabian, ... ) character, a positional notation as binary (base=2), an octal (base=8) notation, a decimal (base=10) notation, a hexadecimal (base=16) notation, or a Roman numeral notation. Optionally, numeric symbols can have a radix point, namely a fractional or real value, or a non-radix form (natural or integer value). Moreover, optionally, symbols can also include pictures, data or database elements, and so forth. Furthermore, numbers and characters can also be represented as symbols that are based on individual numbers or characters, for example ASCII, or as a combination of multiple ASCII symbols that represents, for example, numerical values, words, or sentences.

As aforementioned, a symbolic representation enables a computation for entropy of information to be executed. Moreover, entropy for the same given piece of information can be calculated by using different symbol representations, whereby distinctly different entropy results are produced; for example, different sets of symbols employed to represent the information can result in different entropies for the information as represented by one or more symbols of the sets. Additionally, different symbols can also be entropy-encoded very differently, as required. It is feasible for some representations of the aforesaid information to be entropy-encoded very closely to their ideal entropy, for example as derived via bits with an Arithmetic Coder or Range Coder, whereas some representations require more additional information for entropy encoding to succeed, for example as encountered for words or database elements.

The aforesaid additional information mentioned needs to be delivered in one way or another from a given encoder to a corresponding decoder, so as to enable unique decoding of encoded data to be achieved. Furthermore, it is beneficial when some additional information is already available both at the given encoder and at the given decoder, so that this information does not need to be delivered at all, or it can be delivered in a very small format, for example by using one or more indexes identifying one or more tables.

In other words, a manner in which the aforesaid information is delivered by way of corresponding encoded data makes a big difference to a degree of data compressing that is achievable in the encoded data; possible alternatives are, for example, sending the entire original information itself as original symbols, as symbols in compressed form, or as a selection index to available information alternatives. Moreover, the entire delivered information, or portions thereof, can be reused, which also creates multiple options for compressing the information, corresponding data or corresponding encoded data to an even greater degree.

Especially, when the amount of original data representing the information increases, there often are no suitable static tables or databases available for selection when communicating the information. However, after the delivery of one or more tables in association with communication of the information in encoded form, there is potentially some table that can be reused, for example for other information communicated at a later time whose encoding method refers to that table. It will also be appreciated that the piece of information that is to be compressed is potentially a part of a larger information entity; for example, the piece of information can be analysis results of full or partial data, method parameters for one or more data blocks and so forth, for example multi-level method levels, database references, a part of the original data (for example, ROI, slice of frame, image from video).

When there is a lot of data to be communicated, the entropy of the data dominates the amount of data to be delivered. Similarly, when there is only relatively little data to be delivered, the additional information is often, to a great extent, a major part of the delivered data; in other words, the additional information can potentially represent a considerable data overhead. Thus, there is required a need for an optimization, so that a sum of entropy encoded data and the additional data is minimized; as will be elucidated later, an invented Continuum Operator pursuant to the present disclosure is a very good tool for such purpose of optimization.

There is a large variety of different data compression methods which are contemporarily available for compressing data. Some of the compression methods are specialized for some particular kind of data, for example JPEG/PNG for compressing images, AAC/MP3 for compressing audio, PNG/GIF for compressing graphics, HEVC/VP9 for compressing video, and so forth. Some of the methods are more eclectic, for example BZip, 7Zip, RLE, SRLE, VLC, Range Coding, Arithmetic Coding. Moreover, there are also methods available for modifying an entropy of bit data, for example as employed in an entropy Modifier (EM), as described in a United Kingdom patent application GB1303658.7 which corresponds to allowed U.S. patent application Ser. No. 13/782,757 and ODelta Coding, as described in United Kingdom patent application GB1303661.1 which corresponds to allowed U.S. patent application Ser. No. 13/782,819, and methods of modifying entropy of symbol data that is not represented as individual bits, for example DPCM, Delta Coding, ODelta Coding, RLE, SRLE, as described in a United Kingdom patent application GB1303660.3, corresponding to allowed U.S. patent application Ser. No. 13/782,872. Although Shannon entropy, as described in references [2], [3] and [4], is well known, it is not a generally utilized properly in current compression methods. Shannon entropy can be computed using Equation 1 (Eq. 1) as follows:

$$\text{Entropy} = -\sum_{i=1}^{n} p(x_i) * \log p(x_i) \qquad \text{Eq. 1}$$

wherein:
n is number of different symbols; and
$p(x_i)$ is probability of the symbol indexed by i, Entropy is often multiplied by the number of all symbols so as to make the value more comparable to other calculated entropy values. This comparable entropy value can also be changed to estimate the used bits by dividing the value of comparable entropy by a log(2) value.

Instead of entropy, rate-distortion (RD) optimization is often used in lossy coding for selecting a best compression method or method combination. In lossless coding, entropy per se can be used to select methods or algorithms, because in lossless coding, there is no distortion on which RD-optimization is based, and so the rate alone is conveniently estimated by entropy only, together with additional information.

Interleaving the data corresponding to the aforesaid information is also a known prior art method. For example, pixel color values, for example expressed as RGB as described in reference [11], in a given image can be expressed in a planar form as (RRRR . . . , GGGG . . . , BBBB . . . ) or in an interleaved form as (RGB, RGB, RGB, RGB, . . . ).

In a United Kingdom patent application GB2301252, see reference [10], there is described a known method for encoding bits present in data. The known method employs multiple different length remainder symbols, but the multiple different remainder symbols are utilized in a strictly defined way one after another, they represent different bit dynamics, and the known method is only suitable for bit symbols. However, using any known methods separately or in known combinations is not able to address, to a sufficient degree, any of three major problems related to data compression. All of the aforesaid methods, and combinations thereof, have a multitude of disadvantages.

When information is encoded, for example compressed, three major problems arise:
1) A first problem relating to a manner of selecting a most appropriate form of symbols to be used when information is to be compressed;
2) A second problem relating to a manner of reducing similar consequent symbols most efficiently; and
3) A third problem relating to a manner in which to reduce, for example to a minimum, a data size of encoded data and additional information most efficiently, while still enabling unique data to be decoded, for example decompressed in a decoder.

SUMMARY

The present disclosure seeks to provide an improved method of encoding data, representative of information, to generate corresponding encoded data.

Moreover, the present disclosure also seeks to provide an improved encoder for encoding data, representative of information, to generate corresponding encoded data.

Furthermore, the present disclosure seeks to provide an improved method of decoding encoded data, for example as generated by the aforesaid improved method of encoding data.

Additionally, the present disclosure seeks to provide an improved decoder for decoding encoded data, for example as generated by the aforesaid improved encoder.

According to a first aspect, there is provided an encoder as claimed in appended claim 1: there is provided an encoder for encoding data (D1) provided thereto to generate corresponding encoded data (D2), wherein the encoder includes a data processing arrangement for applying one or more encoding processes to the data (D1) to generate the encoded data (D2), characterized in that:
(a) the data processing arrangement (20) is operable to represent the data (D1) at least partially in a set of numerical value symbols, if the data (D1) is not already expressed in numerical value symbols;
(b) the data processing arrangement (20) is operable to generate intermediate data (40) in which the numerical value symbols are represented by original values and at least one symbol by a modified value with one or more continuum symbols generated by a continuum operator, wherein the one or more continuum symbols modify preceding symbol values to accommodate an extended range of symbols; and
(c) the data processing is operable (20) to process the intermediate data (40) to generate the encoded data (D2).

The present invention is of advantage in that a combination of the one or more continuum symbols added by the encoder is capable of providing an enhanced degree of data compression in the encoded data (D2) relative to the data (D1) to be encoded.

Optionally, in the encoder, the data processing arrangement is operable to split the data (D1) into a plurality of portions or sections, based upon computed probabilities of occurrence of the symbols in the plurality of portions or sections and an efficiency to which they can be compressed.

Optionally, in the encoder, generation of the intermediate data by the continuum operator is used for the symbols in the data (D1) being transformed via one or more transformations and/or via one or more translation tables (LUT). More optionally, in the encoder, the encoded data (D2) is provided via a plurality of data streams, wherein at least one of the streams conveys information indicative of the one or more translation tables (LUT) and/or one or more transformation methods. More optionally, in the encoder, the information indicative of the one or more translation tables (LUT) refers to one or more translation tables (LUT) which are delivered prior to delivering the encoded data (D2) and/or are available from an alternative source to the encoder.

Optionally, the encoder is operable to process the data (D1) including at least one of: captured audio signals, captured video signals, captured images, text data, seismographic data, sensor signals, analog-to-digital (ADC) converted data, biomedical signal data, calendar data, economic data, mathematical data, binary data.

Optionally, in the encoder, the data processing arrangement is operable to encode the intermediate data (40) to generate the encoded data (D2) by employing at least one of: entropy modification (EM) coding, ODelta coding, RLE, SRLE, Arithmetic Coding, Range Coding, VLC.

According to a second aspect, there is provided a method in an encoder of encoding data (D1) provided thereto to generate corresponding encoded data (D2), wherein the encoder includes a data processing arrangement for applying one or more encoding processes to the data (D1) to generate the encoded data (D2), characterized in that the method includes:
(a) using the data processing arrangement (20) to represent the data (D1) at least partially in a set of numerical value symbols, if the data (D1) is not already expressed in numerical value symbols;
(b) using the data processing arrangement (20) to generate intermediate data (40) in which the numerical value symbols are represented by original values and at least one symbol by a modified value with one or more continuum symbols generated by a continuum operator, wherein the one or more continuum symbols modify preceding symbol values to accommodate an extended range of symbols; and
(c) using the data processing is operable (20) to process the intermediate data (40) to generate the encoded data (D2).

Optionally, the method includes using the data processing arrangement to split the data (D1) into a plurality of portions or sections, based upon computed probabilities of occurrence of the symbols in the plurality of portions or sections and an efficiency to which they can be compressed.

Optionally, the method includes generating the intermediate data (40) by the continuum operator for the symbols in the data (D1) that are generated by transforming the symbols via one or more transformations and/or translations defined by one or more translation tables (LUT) and/or one or more transformation methods. More optionally, the method includes provided the encoded data (D2) via a plurality of data streams, wherein at least one of the streams conveys information indicative of the one or more translation tables (LUT) and/or one or more transformation methods. More optionally, in the method, the information indicative of the one or more translation tables (LUT) refers to one or more translation tables (LUT) which are delivered prior to delivering the encoded data (D2) and/or are available from an alternative source to the encoder.

Optionally, the method includes using the encoder to process the data (D1) including at least one of: captured audio signals, captured video signals, captured images, text data, seismographic data, sensor signals, analog-to-digital (ADC) converted data, biomedical signal data, calendar data, economic data, mathematical data, binary data.

Optionally, the method includes using the data processing arrangement to encode the intermediate data to generate the encoded data (D2) by employing at least one of: entropy modification (EM) coding, ODelta coding, RLE, SRLE, Arithmetic Coding, Range Coding, VLC.

Optionally, the method is implemented using one or more software products recorded on non-transitory machine-readable data storage media, wherein the one or more software products are executable upon the data processing arrangement of the encoder for implementing the method of encoding the data (D1) to generate the encoded data (D2).

According to a third aspect, there is provided a decoder for decoding encoded data (D2) provided thereto to generate corresponding decoded data (D3), wherein the decoder includes a data processing arrangement for applying one or more decoding processes to the encoded data (D2) to generate the decoded data (D3), characterized in that:
(a) the data processing arrangement (60) is operable to process the encoded data (D2) to generate intermediate data (40);
(b) the data processing arrangement (60) is operable to process the intermediate data (40) to decode the intermediate data, wherein in the intermediate data numerical value symbols are represented by output symbols and at least by one modified output symbol with one or more continuum symbols that are then decoded by an inverse continuum operator, wherein the one or more continuum symbols modify the modified output symbol value to accommodate an extended range of symbols; and
(c) the data processing arrangement (60) is operable to translate and/or transform the processed intermediate data to represent the decoded data (D3) in a set of symbols.

Optionally, in the decoder, the data processing arrangement is operable to process the encoded data (D2) as a plurality of portions or sections, based upon computed probabilities of occurrence of the symbols in the plurality of portions or sections and an efficiency to which they can be compressed.

Optionally, in the decoder, generation of the set of symbols by the continuum operator are also transformed and/or translated from the decoded data (D3) via one or more transformations defined by one or more translation tables (LUT) and/or one or more transformation methods.

Optionally, in the decoder, the encoded data (D2) is provided via a plurality of data streams, wherein at least one of the streams conveys information indicative of the one or more translation tables (LUT) and/or one or more transformation methods. More optionally, in the decoder, the information indicative of the one or more translation tables (LUT) refers to one or more translation tables (LUT) which are delivered prior to delivering the encoded data (D2) and/or are available from an alternative source to the decoder.

Optionally, the decoder is operable to process the encoded data (D2) including encoded versions of at least one of: captured audio signals, captured video signals, captured images, text data, seismographic data, sensor signals, analog-to-digital (ADC) converted data, biomedical signal data, calendar data, economic data, mathematical data, binary data.

Optionally, in the decoder, the data processing arrangement is operable to decode the encoded data (D2) to generate the intermediate data by employing an inverse of at least one of: entropy modification (EM) coding, ODelta coding, RLE, SRLE, Arithmetic Coding, Range Coding, VLC.

According to a fourth aspect, there is provided a method of using a decoder for decoding encoded data (D2) provided thereto to generate corresponding decoded data (D3), wherein the decoder includes a data processing arrangement for applying one or more decoding processes to the encoded data (D2) to generate the decoded data (D3), characterized in that the method includes:

(a) using the data processing arrangement (60) to process the encoded data (D2) to generate intermediate data (40);
(b) using the data processing arrangement (60) to process the intermediate data (40) to decode the intermediate data, wherein in the intermediate data numerical value symbols are represented by output symbols and at least by one modified output symbol with one or more continuum symbols that are then decoded by an inverse continuum operator, wherein the one or more continuum symbols modify the modified output symbol value to accommodate an extended range of symbols; and
(c) using the data processing arrangement (60) to translate and/or transform the processed intermediate data to represent the decoded data (D3) in a set of symbols.

Optionally, the method includes using the data processing arrangement to process the encoded data (D2) as a plurality of portions or sections, based upon computed probabilities of occurrence of the symbols in the plurality of portions or sections and an efficiency to which they can be compressed.

Optionally, the method includes generating the set of symbols by the continuum operator—which are also transformed and/or translated from the decoded data (D3) via one or more transformations defined by one or more translation tables (LUT) and/or one or more transformation methods. More optionally, the method includes providing the encoded data (D2) via a plurality of data streams, wherein at least one of the streams conveys information indicative of the one or more translation tables (LUT) and/or one or more transformation methods. More optionally, in the method, the information indicative of the one or more translation tables (LUT) refers to one or more translation tables (LUT) which are delivered prior to delivering the encoded data (D2) and/or are available from an alternative source to the decoder.

Optionally, the method includes using the decoder to process the encoded data (D2) including encoded versions of at least one of: captured audio signals, captured video signals, captured images, text data, seismographic data, sensor signals, analog-to-digital (ADC) converted data, biomedical signal data, calendar data, economic data, mathematical data, binary data.

Optionally, the method includes using the data processing arrangement to decode the encoded data (D2) to generate the intermediate data by employing an inverse of at least one of: entropy modification (EM) coding, ODelta coding, RLE, SRLE, Arithmetic Coding, Range Coding, VLC.

Optionally, the method is implemented using one or more software products recorded on non-transitory machine-readable data storage media, wherein the one or more software products are executable upon the data processing arrangement of the encoder for implementing the method of decoding the encoded data (D2) to generate the decoded data (D3).

According to a fifth aspect, there is provided a codec including a combination of at least one encoder pursuant to the first aspect, and at least one decoder pursuant to the third aspect, wherein the at least one decoder is operable to decode data (D2) which is encoded by the encoder.

According to a sixth aspect, there is provided an electronic apparatus including at least one encoder pursuant to the first aspect, and/or at least one decoder pursuant to the third aspect, wherein the electronic apparatus is implemented as a part of at least one of: a personal computer, an audio/visual apparatus, a television, a wireless-enabled computing device, a smart phone, a mobile telephone, an interactive games console, an automobile electronic information system.

Embodiments of present invention beneficially utilize multiple elements and operations that are combined together. Those multiple elements include, for example:

(i) one or more elements for entropy computation, for example for computing Shannon entropy, and its utilization for algorithm selections and processing speedup purposes;
(ii) one or more elements for symbol-to-symbol conversions, for example for combining symbols, for dividing symbols, for converting bits to byte, for converting bytes to bits, for providing conversion of 2-bit symbols to 6-bit symbols and vice versa, for converting characters to words, for converting words to characters/sentences, for converting numbers/characters to values or values to numbers/characters;
(iii) one or more elements for delivering additional information, for example a selected encoding method, for defining method parameters, for providing coding tables, for providing look-up-tables, for providing and/or indicating databases; and
(iv) one or more elements for entropy modification (EM) coding, for Delta Coding (see reference [8]), for ODelta coding, for RLE, for SRLE (see reference [9]), for method as described in UK patent application GB2301252 (see reference [10]) hereby incorporated by reference, and for entropy encoding (for example Arithmetic Coding, Range Coding or VLC, RLE SRLE).

Thus, embodiments of the present disclosure employ improved methods of encoding and decoding symbol data. The improved methods can be used for one-bit data symbols directly or after the transformation to higher dynamic symbols, and also for data symbols with originally higher dynamics. There are also disclosed methods of selecting efficiently between different coding methods by way of calculating by utilizing entropy and additional information. Moreover, in the present disclosure, there are described appropriate combinations of algorithms for identifying a best symbols format to employ, a best entropy modification method and a best encoding method, and also an optimal manner in which such a combination can be used the most efficiently for data compression and decompression.

Moreover, embodiments of the present disclosure beneficially employ a Continuum Operator, namely a new form of numerical symbol value (data) range modifier, and at the same time table or symbol bit count reducer, which is capable of highly reducing the sum of entropy encoded data and additional information. Moreover, the present disclosure provides a new method of encoding and decoding bit and symbol data.

It will be appreciated that features of the invention are susceptible to being combined in various combinations without departing from the scope of the invention as defined by the appended claims.

DESCRIPTION OF THE DIAGRAMS

Embodiments of the present disclosure will now be described, by way of example only, with reference to the following diagram wherein.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF EXAMPLE EMBODIMENTS

In overview, the present disclosure is concerned with improved methods of compressing data and also improved methods of correspondingly decompressing data these improved methods are distinguished in their use of data range modifiers, namely Continuum Operators. Moreover, the data compression and decompression methods combine various different bit or symbol modifiers, different entropy modifiers and entropy coders for compressing and decompressing original information that can be represented as different kinds of bit or symbol data. Furthermore, the compression and decompression methods combine properties from, for example, Split Run Length Encoding (SRLE) (see references [1], [9], and [10]) with an Entropy Modifier (EM) (see reference [13]), and also with at least one advanced Continuum Operator as aforementioned. The at least one Continuum Operator contains at least one continuum value, with positive or negative continuum, that modifies a given original numerical symbol value to a corresponding modified symbol value. The modified symbol created for this continuum value is used at least one time for at least one of the original or already modified symbols. The continuum values are known in advance, or they are delivered separately from the actual data encoding, with or without entropy coding being applied. The used continuum value symbols are included into original or modified symbols data, and they are coded with or without any entropy encoder being applied, namely similarly as the original or modified symbols data in the Continuum Operator modified symbols data.

The Continuum Operator generated symbol streams can still later be compressed with known entropy encoding methods, for example see references [2], [3] and [4], such as Arithmetic Coding (see reference [5]), Range Coding (see reference [6]), or Variable Length Coding (VLC) (see reference [7]) and as well as with known entropy modifiers such as ODelta Coding (see references [8] and [14]), or Entropy Modifier (EM) (see reference [13]). The data that is to be compressed using compression methods of the disclosure can be also modified beforehand by any previously mentioned method, as well as by employing other methods or transformations. The selection of such a compression method combination can be made by using calculated entropy values and a corresponding estimated amount of additional information, but the selection can also be made based on real encoding results which are achievable, for example in an iterative manner by employing different combinations of compressions methods on one or more portions of the original data. Furthermore, in this disclosure, there is also described a decoder that can recover the encoded data back as the original information, for example in a form of bit or symbol data.

In embodiments of the present disclosure, the methods of data compression, and corresponding methods of data decompression, employ data range modifier, referred to as being a Continuum Operator, which is suitable for all bits or symbol data. Moreover, use of the Continuum Operator also optimizes code table delivery needed for the data symbols being entropy coding with any entropy coder or bits needed for delivery of individual data symbols.

Aforementioned improved methods of compressing data, and corresponding methods of decompressing data, combine various different bit or symbol modifiers, different entropy modifiers, and entropy coders for compressing/decompressing the original information that can be represented as different kinds of bits or symbols data. The compression/decompression methods combine properties from, for example, Split Run Length Encoding (RLE/SRLE) (see references [1], [9], and [10]), an Entropy Modifier (EM) (see reference [13]), an ODelta Coder (see reference [14]), and also the Continuum Operator; these references [1], [9], [10], [13] and [14] are hereby incorporated by reference.

The Continuum Operator only adds continuum value symbols to the original numerical value symbols data and simultaneously modifies the original numerical symbol value within the continuum value. This means that any original numerical value symbol is presented in the modified data with one or more numerical value symbols. When the original numerical symbol value is different than the numerical value that is accepted to be as original numerical value, it is replaced with modified numerical value, that is similar than accepted original value, and with one or more continuum values. Often, in practice, this means that when the original numerical symbol value is smaller or equal than a symbol value threshold (SVT), the original symbol value is added into the modified symbol data as it is. Otherwise, one or more continuum value symbols are added to the symbol value delivery. In this case, the last symbol, or the first symbol, is the modified version of the original symbol that is smaller or equal than the SVT and the continuum value symbols are before it, or after it. The result of continuum values and the modified symbol value has to be same as the original symbol value was to enable proper decoding of the Continuum Operator, for example as lossless data compression and decompression.

Due the previous properties, it is always easy to separate the symbol values from the encoded data. Every value that is acceptable value is its own decodable value and all possible continuum values before it (or after it) are used with it when computing the decoded symbol value for it. In other words, there is in the modified data always the same amount of the symbols that are smaller or equal than the SVT (if a 0 value is also an acceptable value) than there was original symbols in the original symbols data. Additionally, there are also one or more continuum value symbols, and those continuum value symbols are different symbols than the modified data symbols or the original data symbols that are smaller or equal than the SVT (if a 0 value is also an acceptable value). Beneficially, the original and modified symbols are presented with symbols from zero to SVT and continuum value symbols are then presented with symbols SVT+1, SVT+2 and so on. Translation of data can optionally be used before the Continuum Operator. Beneficially, the smallest SVT value is 2, because otherwise the utilization of LUT is more efficient than the utilization of Continuum Operator.

The Continuum Operator is employed to generate modified symbol streams that are susceptible to being compressed with known entropy coding methods (see references [2], [3], and [4]), as well as other encoding methods such as Arithmetic Coding (see reference [5]), Range Coding (see reference [6]), or Variable Length Coding (VLC) (see reference [7]). The symbol streams which are modified by the Continuum Operator can also later be modified with known entropy modifiers, such as ODelta Coding (see references [8] and [14]), or Entropy Modifier (EM) (see reference [13]) with or without entropy coders. The data to be compressed can also be modified beforehand, namely a priori, by various aforementioned methods, as well as other methods or transformations.

As aforesaid, the selection of the compression method combination employed can be made by using calculated entropy values and an estimated or calculated amount of additional information, for example table delivery, method selection, continuum value delivery, but the selection can also be made based upon a real encoding result which is achievable, for example in an iterative manner until an optimal combination is found for compressing of the original data and/or one or more portions thereof. Furthermore, there will be elucidated in the following description a decoder that can be employed to recover, namely to decompress, the encoded data back as the original information, for example expressed in bit or symbol data.

Examples of implementations of methods of the present disclosure will next be described. The methods are, for example, implemented in hardwired logic of an encoder, correspondingly a decoder. Moreover, the original data to be compressed is optionally derived from one or more sensors, for example one or more cameras and/or one or more microphones, which convert real physical phenomena into corresponding representative data. Alternatively, the methods are implemented via use of computing hardware which is arranged to execute one or more software products recorded on non-transitory (i.e. non-transient) machine-readable data storage media, wherein the software products implement the aforesaid methods of the present disclosure. In the examples that will next be described, a piece of original sample information is compressed both by using methods of the disclosure; to some comparisons with results achievable using known prior art methods will also be provided.

An example piece of information containing N symbols can be presented as in Equation 2 (Eq. 2):

$$s1, s2, s3, \ldots sN$$

$$\text{or } s0, s1, s2, \ldots, sN-1$$

$$\text{or } s(1), s(2), s(3), \ldots s(N), \text{etc.} \quad \text{Eq. 2}$$

In the original information, symbols therein can be split to separate sequences or streams before or after the aforementioned Continuum Operator is used. Similarly, if there are many sequences or streams, they can be combined to provide one or more symbols before or after the Continuum Operator.

Based on one or more computations of entropy of one or more portions of the original data as represented by symbols, and estimated additional information, it is feasible to determine which is a best alternative form of symbols, representative of the original information, to encode, namely compress, the original information. The aforesaid entropy for symbols representative of the original information can be computed based on probabilities of the symbols required to represent the original information. Likewise, entropy for combined symbols can be calculated based on probabilities of occurrence of the combined symbols. It will be appreciated that there are usually distinctly less combined symbols than there are original symbols, as well as there being fewer combined streams than original streams of the original information.

It will also be appreciated that there is always more additional information associated with combined symbols or combined streams than there is for corresponding original symbols or original streams; in other words, there is a data head associated with indicating that one or more symbols and/or one or more streams have been combined in a given process for generating corresponding compressed data. That is because, typically, the correlation between combined symbols is not equal to 1. Additionally, some sort of mechanism is necessary to indicate which combined symbols have non-zero probability, because otherwise the delivery of a VLC code table or Range Coding probabilities, for example, consumes a huge amount of additional information when employing entropy coding. The amount of additional information is also a more significant data portion when less original data is needed to be delivered or coded.

Similarly, entropies for divided streams or symbols can be computed based on the probabilities of divided streams or symbols. If multiple streams are created based upon division of the original data, then the entropy for each stream is beneficially calculated separately and then summed together. Moreover, additional information is needed for each stream separately. Typically, any of those individual sequences of additional information concerning the split are smaller in data size than the additional information needed for one stream, but the sum of all sequences of additional information of the streams can be smaller or larger than the additional information needed for one stream. The data size of additional information is typically reduced, for example reduced to a minimum, when the original information is split or combined from 1-bit to 8-bit symbol streams. When all entropies and sequences of additional information are known, a best symbol format can be selected by reducing to a minimum the entropy bits and the additional information.

Optionally, it is also possible to create SRLE symbols and runs streams for use in compressing data pursuant to the present disclosure, based on the original symbols; reference is herewith made to United Kingdom patent application GB1303660.3, similarly U.S. patent application Ser. No. 13/782,872, whose contents in this respect are herewith incorporated by reference. An example for obtaining symbols for two streams is as follows in Equation 3 (Eq. 3):

$$S(1), S(x1), S(x2), \ldots \text{ (for symbols); and}$$

$$R(1), R(x1) R(x2), \ldots \text{ (for runs)} \quad \text{Eq. 3}$$

wherein:
S(1) is a first symbol; and
R(1) is a run of similar consequent symbols S(1).

A symbol S(x1) is a next different symbol after the run R(1) of consequent S(1) symbols, and R(x1) is the run of similar consequent symbols S(x1), and so forth.

The symbols S can also be expressed as follows:

$$S(1), S(1+R(1)), S(1+R(1)+R(2)), \ldots \text{ (for symbols)} \quad \text{Eq. 4}$$

Now, the entropy of such a kind of combination can also be compared against earlier alternatives, for example when iterating to an optimal method to employ when compressing the original information.

Entropy modifiers and entropy coders are available for processing bit data, namely for handling data in a bit-by-bit manner, for example as described in a United Kingdom patent applications GB1303658 and GB2301252, but they are not suitable for processing higher-order symbol data. These kind of continuum symbol, remainder symbol or escape symbol methods for handling bit data can also be modified to be used for symbol data with features as described in this disclosure; for example, a run stream of SRLE, not RLE wherein there are runs and symbols in a same stream, can be modified by using a similar continuum symbol technology that was used in EM for the run stream of bits Most of the known implementations of RLE/SRLE do not employ continuum symbols, remainder symbols or escape symbols, except with bits as described in the foregoing. Very long runs of similar symbols are delivered by adding the same symbol again with the new run number, when there are more consequent similar symbols that can be expressed with the maximum run value, for example 8-bit.

In a first example, if 8 bit symbols are used with 8-bit runs and there are 300 consequent "A" characters, then a corresponding RLE is written as: A255 A45 (namely a same amount of symbols and runs in the stream). There is also a second RLE solution that uses a run value only (and always) when there are at least two is similar symbols, but is devoid of a run value for individual symbols. The same example can be represented as AA255 AA45 (namely at least two times symbols compared to runs in the stream). As aforementioned, RLE/SRLE does not actually use any continuum symbols, remainder symbols or escape symbols (namely codes), but there might be consequent similar symbols with own runs. Moreover, it is also possible to split symbols and runs to the different streams using SRLE (see reference [9]). Now, the first streams are expressible as AA and 255, 45 and the second streams are expressible as AAAA and 255, 45. However, it will appreciated that the value 255 has a special significance, and is based on byte (8-bit) dynamics; the value 255 is neither an continuum value, remainder value or escape symbol nor code. The value 255 can be used also alone in a different place, and it does not require additionally the delivery of escaped run value with higher than 8-bits, for example with 16 bits. When an escape symbol (code) solution is employed with SRLE, there are beneficially at least three streams used, for example A in a symbols stream, Escape symbol (for example 0) in a runs stream, and 300 in an escaped run value stream.

Next, there will be described an example which uses the aforesaid Continuum Operator in combination with a SRLE method. The number of Continuum Operator modified runs symbols have to be larger than the number of original runs symbols, whereby continuum value symbols used for representing the number of similar symbols still continuing are added, namely (continuum+/− value(s) and modified symbol value or modified symbol value and +/−continuum value(s)), when the run symbol value is higher than the selected one or more continuum values and at least higher than symbol value threshold (SVT) value. For example, when there are N (=330) symbols, the run values are as follows in Equation 5 (Eq. 5):

$$2, 7, 9, 102, 12, 21, 19, 3, 1, 6, 18, 18, 16, 10, 5, 37, 9, 5, 2, 18 \quad \text{Eq. 5}$$

This stream, namely 20 symbol values in total, with run values, in a range of 1 to 102; can be compressed, for example, via use of Variable Length Coding (VLC), Range Coding, or Arithmetic Coding. Moreover, it will be appreciated that all of the original run values have to be greater or equal to 1, and a maximum run value has to be smaller or equal to N=number of all symbols=330. The delivery of these symbols directly takes, for example, 20×9=180 bits, wherein the value 330 can be represented with 9 bits, or 4+20×7 144 bits, wherein 4 bits are used to deliver bits for symbol (=7, because value 102 can be presented with 7 bits). The delivery of a corresponding coding table will take considerably more bits, if a suitable fixed coding table is not available, for example a fixed predefined coding table, and so the entropy coding methods most probably cannot efficiently be used with this kind of data in Equation 5 (Eq. 5).

It is feasible, pursuant to embodiments of the present disclosure, to select one continuum value, for example 19+, which is similar to a SVT value, for example by using con-siderable computing effort via a SVT value optimizer, and then by using a symbol 0, because zero cannot be in the original run stream, for representing the continuum value in the modified run stream. Now, it is feasible to modify these run R(x) values to be as modified run R'(x) values as below in Equation 6 (Eq. 6):

$$2, 7, 9, 0,0,0,0,0,7, 12, 0,2, 19, 3, 1, 6, 18, 18, 16, 10, 5, 0, 18, 19, 5, 2, 18 \quad \text{Eq. 6}$$

The symbols (0,x) means a value (19+x) during decoding, and similarly symbols (0,0,0,x) mean, for example, a value (19+19+19+x) or (19±(19+(19+x))) during decoding. The sum of Continuum Operator modified run R'(x) symbol values is still 330 during decoding, because the zero values can be replaced by a value 19 when the sum is computed. The number of symbols is thereby increased from 20 to 27, namely 7 zeroes are added due to 3 run values higher than SVT value being available. This stream, namely 27 symbols, with symbol values (1 to 19+0) can be delivered with, for example, 6+27×5=141 bits; 6 bits are used to deliver the continuum value (cont+), which is similar to a SVT value (=19), and 20 (=1 to 19+0) different symbol values can be differentiated with 5 bits. This data can also be compressed, for example, by employing VLC, Range Coding or Arithmetic Coding, using table delivery for a coding method as described in references [15] and [16], hereby incorporated by reference.

The Continuum Operator is optionally modified to contain more continuum values, for example cont1+=19+ and cont2+=50+. Moreover, the SVT value is similar as cont1+(=19+) value and is 19. The first continuum value, namely cont1+, value uses still symbol 0 and the second continuum value, namely cont2+, will be allocated a symbol 20 (=SVT+1). The Continuum Operator modified run stream R'(x) can then be written as provided in Equation 7 (Eq, 7);

$$2, 7, 9, 20,20,2, 12, 0,2, 19, 3, 1, 6, 18, 18, 16, 10, 5, 0,18, 19, 5, 2, 18 \quad \text{Eq. 7}$$

Now, in Equation 7, the run value "102" is coded by employing symbols (20,20,2) instead of symbols (0,0,0,0,0, 7), and the total number of run symbols is then reduced to 24 symbols. This stream, namely 24 symbols, in Equation 7, with symbols (0 to 20) can be delivered with, for example, 6+6+24×5=132 bits (6 bits are used to deliver continuum (19, and 50) values and 21 (cont1 (=0), cont2 (=20) and values from 1 to 19) different symbol values can be presented by using 5 bits per symbol value). This data can also be compressed by utilizing, for example, VLC, Range Coding or Arithmetic Coding, as aforementioned, using a table delivery for coding method as described in references [15], [16], which are hereby incorporated by reference. When a plurality of continuum values is used, delivery of those continuum values can also be in a differential manner, for example 19 and 31 instead of 19 and 50. Optionally, if a continuum value having a negative value is used, information indicative of the value being negative also needs to be communicated, for example by employing a sign bit or different coding method, when the continuum values are delivered, for example to a decoder or data storage device. Beneficially, the new continuum value is defined, if otherwise more than two or three other continuum values should have to be used.

Beneficially, the original symbols in the original symbol stream are translated before the Continuum Operator is used for them, and so that translated stream contains 0 value as a smallest value therein. There will next be described example translations of the run values before use of the Continuum Operator, and this modifies results which are achievable. The continuum values are also slightly modified in the following example. It will be appreciated that run symbol values have to be in a range of 1 to N, as aforementioned; these symbols require translating by 1 without delivering any information. Now, the original R(x) stream is presented as a T(x) stream for transmission, as provided in Equation 8 (Eq. 8):

$$1, 6, 8, 101, 11, 20, 18, 2, 0, 5, 17, 17, 15, 9, 4, 36, 18, 5, 1, 17 \quad \text{Eq. 8}$$

Optionally, it is feasible to select the SVT value to be, for example 18 (=19−1), but in the following there is employed a selected SVT value of 19. Moreover, two continuum values are selected as cont1+(=SVT+=19+) with symbol 20 and cont2+(=100+) with symbol 21. This causes corresponding Continuum Operator modified translated symbols T'(x) to be a stream as provided in Equation 9 (Eq. 9):

$$1, 6, 8, 21, 1, 11, 20, 1, 18, 2, 0, 5, 17, 17, 15, 9, 4, 20, 17, 18, 4, 1, 17 \quad \text{Eq. 9}$$

As a result, the total number of run symbols in this stream is 23 symbols. This stream of 23 symbols, with symbols (0 to 21), can be delivered with, for example, (5, 6, or 7)+7+23×5=127 to 129 bits, (wherein 5-7 bits are used to deliver the cont1+(=19+) value, 7 bits is used to deliver the cont2+(=100+) values and 22 (=0 to 19+20+21) different symbol values can be represented by using 5 bits for each symbol value). This data can also be compressed, for example, by employing VLC, Range Coding or Arithmetic Coding, using table delivery for coding method as described in references [15], [16], hereby incorporated by reference.

It will be appreciated that the symbol stream S(x) after the Continuum Operator optimized for SRLE implementation can also be compressed using any entropy coding method. If the S(x) contains bit values, only the first bit value needs to be delivered, as known from EM in reference [13], or information of the first bit value needs to be delivered, because other values are known to change one after another when using the Continuum Operator for run values, thereby enabling only one run value being needed to be deliver for continuous similar symbol values; for example, if S(x)=1, 0, 1, 0, 1, 0, 1, 0, 1, then the first value 1, or information of its value 1, for example with coding method: _1_EM_CM_Range, is the only delivered information for the symbols S(x) and Continuum Operator modified R'(x) or T'(x) values are delivered with it for run R(x) values. When other than bit values are compressed with the Continuum Operator optimized for SRLE implementation, it is known that there two similar consequent values in S(x) stream do not occur, but it still cannot be known what the next value will actually be. For that reason, it is necessary to compress the symbol values S(x) also with some entropy coding method as well as compressing the Continuum Operator modified R'(x) to T'(x) values.

Although the Continuum Operator is primarily intended for delivering the run symbols after EM or SRLE, as aforementioned, it can also be used when compressing any symbols. Any symbol stream that contains many small values and only a few high values can be efficiently encoded with or without entropy coding, when they are first modified with the Continuum Operator, Sometimes, when there are also many high and/or medium values, the Continuum Operator potential may still be an appropriate method to employ, for example in an event that the symbol s(x) values are as provided in Equation 10 (Eq. 10):

$$3, 1, 252, 254, 2, 252, 1, 1, 252, 0, 254, 3, 6 \text{ (3 symbols)} \quad \text{Eq. 10}$$

Then, the Continuum Operator modified symbol values s'(x) are with SVT=3 and continuum values cont1+(=3+) with symbol=4 and cont2+(=252+) with symbol=5 as provided in Equation 11 (Eq. 11):

$$3, 1, 5, 0, 5, 2, 2, 5, 0, 1, 1, 5, 0, 0, 5, 2, 3, 4, 3 \text{ (13+1+} 5=19 \text{ symbols)} \quad \text{Eq. 11}$$

Thus, the original stream in Equation 10 (Eq. 10) contains 8-bit symbol values, namely 0 to 254, and are potentially delivered with 13×8=104 bits. The Continuum Operator modified stream in Equation 11 contains 19 symbols that can be delivered with only 3 bits per symbol (0 to 5) and can be delivered with 8+8+19×3=16+57=73 bits; this result represents a considerable compression of data those 16 bits in this computation resulting in 73 bits are maximally needed to deliver these two continuum values.

When an attempt is made to compress the same symbol stream, namely Equation 10 (Eq. 10), with a method using one or more escape symbols (code), a resulting data compression attainable is not as successful as presented above for Equation 11 (Eq. 11). The frequencies of the symbols are quite similar and an escape symbol (code) typically is not used at all. On account of the delivery of coding table or original symbols using a considerable amount of bits of escape symbol (code), attempts could be made to reduce the coding table delivery or for reducing the hits needed to deliver small symbol values; for example when the values above 6 are delivered with escape symbol (code) and other symbols with their own symbol values, then the coding table or small values themselves contain only values from 0 to 6 and an escape symbol (code) (=8 different symbols). In such a situation, the delivery of symbols uses 8 (value 6 has to be delivered)+13×3 (codes for every symbol–original or escape)+5×8 (escaped values after escape symbols)=8+39++40=87 bits. The result is clearly better than without use of one or more escape symbols (code), but the result is still inferior to that obtained by use of the Continuum Operator modified results. Even more beneficial results for the Continuum Operator are obtained when some medium values are also present in the stream.

A further example will next be described. Wherein the original stream s(x) is as provided in Equation 12 (Eq. 12):

$$3, 1, 252, 254, 2, 252, 1, 1, 252, 0, 254, 3, 6, 147, 149, 2, 253, 148, 152 \text{ (20 symbols)} \quad \text{Eq. 12}$$

Then, the Continuum Operator modified symbol values s'(x) are with SVT=3 and continuum values cont1+(=3+) with symbol=4, cont2+(=147+) with symbol 5, and cont3+(=252+) with symbol Gas provided in Equation 13 (Eq. 13);

$$3, 1, 6, 0, 6, 2, 2, 6, 0, 1, 1, 6, 0, 0, 6, 2, 3, 4, 3, 5, 0, 5, 2, 2, 6, 1, 5, 1, 1, 5, 4, 2 \quad \text{Eq. 13}$$

The original stream contains 8 bit values (0 to 254) and could be delivered with 20×8=160 bits, and the Continuum Operator modified stream contains 32 (=20+2+4+6) symbols that can be delivered with only 3 bits per symbol (0 to 6) and can then be delivered with 8+8+8+32×3=24+96=120 bits; those 24 bits are maximally needed to deliver these three continuum values.

With regard to the escape symbol (code), when values, for example, above 6 are delivered with at least one escape symbol (code) and other symbols with their own value, the coding table or small values contains only values from 0 to 6 and the at least one escape symbol (code) (=8 different symbols). In such a situation, the delivery of symbols uses 8 (value 6 have to be delivered)+20×3 (codes for every symbol–original or escape)+10×8 (escaped values after escape symbols)=8+60+80=148 bits. This compression result is still better than without use of at least one escape symbol (code), but the result is still inferior to a result obtainable by using the Continuum Operator.

It will be appreciated that the first continuum value beneficially always defines the SVT. For that reason, the first continuum value should be as small value as possible, depending upon the frequency of the symbols in the origin & stream. The other continuum values can also be used for reducing the bits needed to deliver bigger symbol values and, typically, they are clearly higher values than the first continuum value. All the continuum values are allocated their own symbols and beneficially those symbols are as SVT+1, SVT+2, and so forth. If X represents an amount of continuum values that are used than there is 0 to SVT original or modified symbols and X continuum values=>(SVT+1)+X different symbols are available in the modified stream, namely when translation was used before the Continuum Operator.

Of course, if the translation is not used and, as a consequence, for example, there are no 0 symbols used in the original stream, then the symbol 0 can also be used for the first continuum value. In such a situation, the Continuum Operator is implemented so that it never either produces a 0 symbol for other than continuum purposes; for example, if the continuum value is 3 (symbol=0), and the run is 3, it cannot be coded with symbols (0,0), but it has to be coded with a symbol (3) instead. In this example, it well be appreciated that often symbol (3) is even better to code than symbols (0,0), but when; for example, cont1=3+(symbol=0) and cont2=30+(symbol=4) and the run value 30 needs to be delivered, then there is a need to use symbols (0,0,0,0,0,0,0,0,0,3) and it is not possible to utilize symbols (4,0).

Often, when one or more first values are not available in the original data stream, then it is better to translate the symbol values before the Continuum Operator by using an already known, for example with runs it is 1, offset value or delivered offset value. Then, the continuum value symbols for top of SVT symbols are used; for example, if there is present in a given stream values from 3 to 200, then it is beneficial to employ an offset −3 to original symbols, and thereby obtain values 0 to 197 to provide the translated symbols. Now, if it is beneficial to select the SVT as 10 and the cont1 value as 10+, and thereby obtain symbol 11 for it. Other continuum values will be allocated symbols starting from 12 to as many as they are needed. Thus, in conclusion, all the small values are used for original or modified symbols and continuum values are allocated symbols as SVT+1, SVT+2, and so on.

It is also be appreciated that, with the Continuum Operator, there has to be at least one continuum value defined (=SVT+) with its own symbol (for example SVT+1), and it is used at least one time in the modified symbol stream. There can also be multiple continuum values (cont1, cont2, . . . contN) defined and used in the modified symbol stream. One original symbol can be presented with zero, one or more continuum value symbols and with one symbol that is smaller or equal to SVT; for example, if cont1=10+(represented by using symbol 11) and cont2=100+(represented by using symbol 12) and values (0 to 10) employ original symbols (0 to 10), then for example, the value 7 is presented without a continuum value symbol (7), values 17 and 107 are presented with one continuum value symbol (11,7 and 12,7), values 27, 117, and 207 are presented with two continuum value symbols (11,11,7 and 12,11,7; and 12,12,7), and values 37, 127, 217, and 307 are presented with three continuum value symbols (11,11, 11,7 and 12,11,11,7 and 12,12,11,7 and 12,12,12,7), and so on. One original symbol can be constructed from one or more continuum value symbols and the continuum value symbols can be mutually similar or different. There can also be higher continuum value symbols which are utilized used alone, namely without using lower continuum value symbols, for the one original symbol. Depending on the selected continuum values and the selected decoding equation, the order of the actual continuum symbols can often be changed quite freely. E.g. in the previous example, when only positive continuum+ values were used for example the value 217 can represented as 12, 12, 11, 7 or 11, 12, 7 or 11, 12, 12, 7.

ODelta Coding described in reference [14], hereby incorporated by reference, can also be used to improve the coding result achievable. Typically, it is used for the original symbol data when the symbols are numbers or values, and then it is possible to implement subtraction or sum computations between the symbols.

Optionally, it is also possible firstly to convert the available symbols to a palette, in other words numbers representing them by a look-up table (LUT), which also needs to be expressed or delivered; it is then feasible to use those symbols directly or with ODelta Coding, as aforementioned. Decreasing the number of the symbols by using a table is potentially highly beneficial in a case where the symbols are already numbers or values, but the numbers or values are sparsely distributed in a whole corresponding dynamic range of symbols.

When the information to be processed contains multiple channels, for example RGB image pixels, the information can also be transformed to different values, namely within a colour ("color": US Spelling) space, that are reversible, or sometimes nearly reversible is sufficient, back to the original values, namely within a colour ("color": US spelling space) by using an inverse transformation. A representative example of such a transformation pair is RGB-to-YUV and YUV-to-RGB transformations, as aforementioned. Typically, natural images are compressible in YUV color space, as described in reference [12], hereby incorporated by reference, because a majority of the information, and also the most important information, is present in the Y channel, and colour ("color": US spelling) channels U and V can be sampled down, for example to YUV420 or YUV422 to achieve better compression ratio. There is quite a considerable correlation between R, G, and B channels and this correlation is reduced by performing the RGB-to-YUV transformation. Moreover, other transformations can be used, if they reduce the correlation between the information in different channels.

There exist also many symbols that are not numerical values. For example, characters need to be first changed to numerical values, before they are processed with a Continuum Operator. Typically, the transformation is, for example, A=0, B=1, C=2, etc., but other transformations can also be used. For example, a probability of different characters in some language can often be a very useful transformation method, namely the characters are represented by their probability order.

The Continuum Operator always inputs values that have the same dynamic range, namely bit width, word length, a hit count used to express a symbol). Moreover, the Continuum Operator often returns values with a relatively smaller dynamic range after processing; in other words, fewer bits are used to express the symbol, after processing. At the very least, there will always have to be less possible different symbol alternatives in result data, namely processed data, than there were originally in the input data.

An excellent example of how the Continuum Operator can be used to reduce a size of data size is the Roman numeral system. The numeral system already nicely defines a small set of symbols, namely I=1, V=5, X=10, L=50, C=100, D=500, and M=1000, wherein the small set of symbols can be used to represent positive integer values, for example from 1 to 4000; these 4000 different symbols can be presented by employing 12-bits per symbol by using a bit notation. Similarly, these 7 different Roman numerical notation symbols, namely I=0, V=~1, X=2, L=3, C=4, D=5, M=6, can be presented with 3-bits per symbol. Often, a positive integer value can be presented with less than 4 Roman numeral symbols, and so the Roman numerical notation is more efficient for that particular symbol than the bit notation. There are still three big disadvantages when this kind of operator is used. Firstly, there is no support for a zero value, or for negative values without sign. Secondly, the positive integers cannot be separated from each other if there is no additional information available, for example a space between values. Thirdly, an associated "SVT" value is too small. It can be detected to be the SVT value, and the other characters can be detected to be other continuum values. However, the SVT value is now too small, which can also cause problems, when, for example, the number 8 or 3333 are to be expressed. For example, if there are positive integer values as follows:

11, 9, 33, 101, 4, 2, 1, 8, 3, 10, 34, 68 then there are 12 symbols→12×12 bits=144 bits or 12×7 bits=84 bits. Moreover, at least 101 different symbols have to be available to present all values without specific separators. Then, a corresponding Roman numerical notation can be presented as:

XI, IX, XXXIII, CI, IV, II, I, VIII, III, X, XXXIV, LXVIII wherein there are=36 symbols+11 separators→36*3=108 bits.

It will be appreciated that since these are positive integers, sign information does not need to be delivered. Thus, if we use offset=−1 we get stream s(x) as:

10, 8, 32, 100, 3, 1, 0, 7, 2, 9, 33, 67

Moreover, if there is a selection SVT=3, cont1+=34 (symbol=4), cont2+10+(symbol=5), cont3+=33+(symbol=6) and cont4+=100+(symbol=7) and so on, then this method such a notation is conveniently referred to as being a Roman Continuum Operator, and no additional information, other than an associated method itself, needs to be delivered when it is used. Now, the stream s'(x) after this operator is as follows:

5,0, 4,4,2, 5,5,5,2, 6,6,6, 3, 1, 0, 4,4,1, 2, 4,4,3, 6,0, 6,6,1 wherein there are=23 symbols+0 separators→28*3=84 bits.

These continuum operated symbols do not need any specific separator, but they can be written together, and it can still be known how many symbols there are and how they can be formed just by detecting all the symbols, or symbol values, from 0 to 3 from the modified stream. This means that for Continuum Operator processed values, namely using 8 different symbols, 504425552666131044124436066l is also valid, but for Roman numerical notation, using 5 different symbols, XIIXXXXIIICIIVIIIVIIIIIIXXXXIVLXVIII is not valid, because the amount of numbers and their values cannot be decoded from the stream, namely one or more ambiguities arise. It will also be appreciated that the smaller the amount of different symbols that there are, the less additional information is needed for compression table delivery, for example when an entropy coding method is used after the operation. For that reason, the Continuum Operator processed symbols are superior in comparison to binary notation, although a minimal necessary amount of bits in the previous example, without entropy coding, would be the same.

As aforementioned, it is also feasible, pursuant to the present disclosure, to split the original symbol data to a plurality of sections or portions. Often, there are separate probabilities for symbols available for different sections of data, and thus it is beneficial to encode each section or portion independently. For that reason, the stream of symbols can be split into multiple sections before applying the Continuum Operator, as aforementioned.

Different methods can be used for encoding the original information, namely symbol data, for generating the encoded data; optionally, for example, the different methods are performed in the following order (i) to (iii):
(i) ODelta Coding;
(ii) Continuum Operator; and
(iii) Range Coding.

Such an encoding method is executed in an encoder pursuant to the present disclosure, implemented as hardwired logic, in an application-specific integrated circuit (ASIC), and/or in one or more software products recorded on non-transitory (non-transient) machine-readable data storage media wherein the one or more software products are executable upon computing hardware for implementing the encoding method. The computing hardware is optionally included a personal computer, an audio/visual apparatus, a television, a wireless-enabled computing device, a smart phone, a mobile telephone, an interactive games console, an automobile electronic information system, but not limited thereto.

The decoding of encoded data back to the original information (symbol data) is made in the inverse order, for example in a decoder pursuant to the present disclosure, in steps (i) to (iii):
(i) inverse Range Coding;
(ii) inverse Continuum Operator; and
(iii) inverse ODelta Coding.

Such an decoding method is executed in an encoder pursuant to the present disclosure, implemented as hardwired logic, in an application-specific integrated circuit (ASIC), and/or in one or more software products recorded on non-transitory (non-transient) machine-readable data storage media wherein the one or more software products are executable upon computing hardware for implementing the encoding method. The computing hardware is optionally included a personal computer, an audio/visual apparatus, a television, a wireless-enabled computing device, a smart phone, a mobile telephone, an interactive games console, an automobile electronic information system, but not limited thereto.

Further examples of the present disclosure will next be described, wherein a piece of original sample information is to be compressed. The piece of original sample information optionally includes at least one of: captured audio signals, captured video signals, captured images, text data, seismographic data, sensor signals, analog-to-digital (ADC) converted data, biomedical signal data, calendar data, economic data, mathematical data, binary data but not limited thereto. During compression of the original information, a combination of known and new methods of data processing are optionally employed.

As aforementioned, the continuum values are optionally provided also with negative continuums. This is a very beneficial approach when the ODelta Coded symbols are modified with the Continuum Operator. If there are, for example, 7-bit original values and those are modified by employing an ODelta operator, using highValue as 80, then there are a lot of values near to 0, and lot of values near to 80 in the ODelta Operator modified stream. Moreover, it will be appreciated that in the ODelta Operator modified symbols, a symbol 0 means the same as a previous value, a symbol 1 means a previous value+1 and symbol 80 means a previous value−1, and so forth. The stream D(x) could be as expressed as provided in Equation 14 (Eq. 14):

$$4, 0, 80, 0, 1, 80, 79, 0, 0, 2, 0, 0, 0, 80, 1, 0, 1, 0, 1,\\ 80, 78 \text{ (21 symbols)} \qquad \text{Eq. 14}$$

If there is employed SVT=2, cont1=2+ with symbol 3 and cont2=80− with symbol 4, then there is obtained D'(x) after the Continuum Operator as provided in Equation 15 (Eq. 15):

$$3,2, 0, 4,0, 0, 1, 4,0, 4,1, 0, 0, 2, 0, 0, 0, 4,0, 1, 0, 0, 1,\\ 4,0, 4,2 \qquad \text{Eq. 15}$$

The symbols (4,x) means now values (80−x). Moreover, the original stream contains 7-bit values (0 to 80) and are deliverable by employing 21×7=147 bits, and the Continuum Operator modified stream contains 28 (=21+1+6) symbols that can be delivered with only 3 bits per symbol (0 to 4), and can thus then be delivered with 7+8+28×3=15+84=99 bits; the 15 bits are maximally needed to deliver these two continuum values. The first value represents SVT and has to be positive and between 0 and 80, namely 7 bits maximally are needed to express it, and the second value uses, for example, 1 bit for defining whether the continuum value is positive or negative, and 7 bits maximally are needed for expressing the second absolute continuum value. This stream can easily be compressed later by using, for example, Range Coding, Arithmetic Coding, or VLC Coding, because the frequencies of the symbols are from 0 to 4 as (13, 5, 3, 1, 5). It will be appreciated that the ODelta operator in combination with the Continuum Operator enables delivery of all similar than previous values, namely zero difference, or values with positive delta, namely with positive difference, as absolute values, without any bit needed for sign, and it also enables delivery of values with negative delta, namely negative difference, by using cont2-symbols as sign indication and an absolute value after that. For that reason, this combination represents a very efficient compression method and enables significant reduction of bits needed to deliver original symbol values; in other words, efficient data compression is thereby achievable.

Optionally, there can be a plurality of positive and negative continuum values used, and the result of decoding can always be calculated by using the following equations, wherein, this time, there are three continuum value symbols used for one symbol s(x). Equation 16 (Eq. 16) uses a notation, wherein a last symbol is a modified symbol and the continuum value symbols are before it. A reverse solution can also be optionally used. Moreover, other amounts of continuum value symbols can also optionally be used.

$$s(x) = \text{cont}a(s'(y-3)) + /-(\text{cont}b(s'(y-2)) + (\text{cont}c(s'(y-1)) + /-s'(y))) \qquad \text{Eq. 16}$$

wherein x is the index of original symbols;

y is the index for corresponding modified symbol; and conta, contb and contc are used continuum values.

Positive or negative continuum values can optionally be used, and so the corresponding +/− operator is used in an actual computation; for example, there would therefore arise in the previous example a first symbol 4,3,3,1 then the decoding value is as follows in Equation 17 (Eq. 17)

$$s(0) = \text{cont}a(s'(3-3)) + /-(\text{cont}b(s'(3-2)) + /-(\text{cont}c(s')(3-1)) + /-s'(3))) = 80-(2+(2+1)) = 75 \qquad \text{Eq. 17}$$

It is also possible to use another Equation 18 (Eq. 18), where the positive and negative continuum values are following each other, namely in contiguous manner, without any additional brackets used as presented below:

$$s(x) = \text{cont}a(s'(y-3)) + /-\text{cont}b(s'(y-2)) + /-\text{cont}c(s'(y-1)) + /-s'(y) \qquad \text{Eq. 18}$$

For example, in the previous example, when the first symbol is 4,3,3,1, then the decoding value is as provided in Equation 19 (Eq. 19)

$$s(0) = \text{cont}a(s'(3-3)) + /-\text{cont}b(s'(3-2)) + /-\text{cont}c(s'(3-1)) + /-s'(3) = 80-2+2+1 = 81 \qquad \text{Eq. 19}$$

This example is not optimal, because the end value is out of the original symbol range. However, if there were also a third symbol 5 used for a third continuum value (cont3+=10+), then an improvement is thereby derived; for example, in the previous example including the first symbol 4,5,3,1, the decoding value is as provided in Equation 20 (Eq. 20):

$$s(0) = \text{cont}a(s'(3-3)) + /-\text{cont}b(s'(3-2)) + /-\text{cont}c(s'(3-1)) + /-s'(3) = 80-10+2+1 = 73 \qquad \text{Eq. 20}$$

This same first symbol 4,5 with other equation (Eq. 20) is decoded as provided in Equation 21 (Eq. 21):

$$s(0) = \text{cont}a(s'(3-3) + /-\text{cont}b(s'(3-2)) + /-\text{cont}c(s'(3-1)) + /-s'(3) = 80-(10+2+1) = 67 \qquad \text{Eq. 21}$$

Moreover, many other decoding functions can be used depending what kind of continuum encoding operators are selected to be used. There always have to be 1 modified symbol and one or more continuum symbols in the equation; different operators can be used with and without brackets. One quite different function is, for example, the following Equation 22 (Eq. 22), wherein instead of cont+/−operators, there are used +/−cont operators, wherein the modified symbol is before the continuum values:

$$s(x) = -(s'(y) + /-\text{cont}a(s'(y+1)) + /-\text{cont}b(s'(y+2)) + /-\text{cont}c(s'(y+3))) \qquad \text{Eq. 22.}$$

If the symbols are now 1, 4, 5, 3 then:

$$s(0) = -(s'(0) + /-\text{cont}a(s'(0+1)) + /-\text{cont}b(s'(0+2)) + /-\text{cont}c(s'(0+3))) = -(1-80+10+2) = 67 \qquad \text{Eq. 23}$$

It will be appreciated that, when the modified symbol is before the continuum values, the end of modified symbol can be detected only based upon the next new symbol, namely new original or modified value, or based on end of data (for last symbol). For that reason, it is often more beneficial to use continuum values that are before the modified values than continuum values that are after the modified values.

Figure 1:
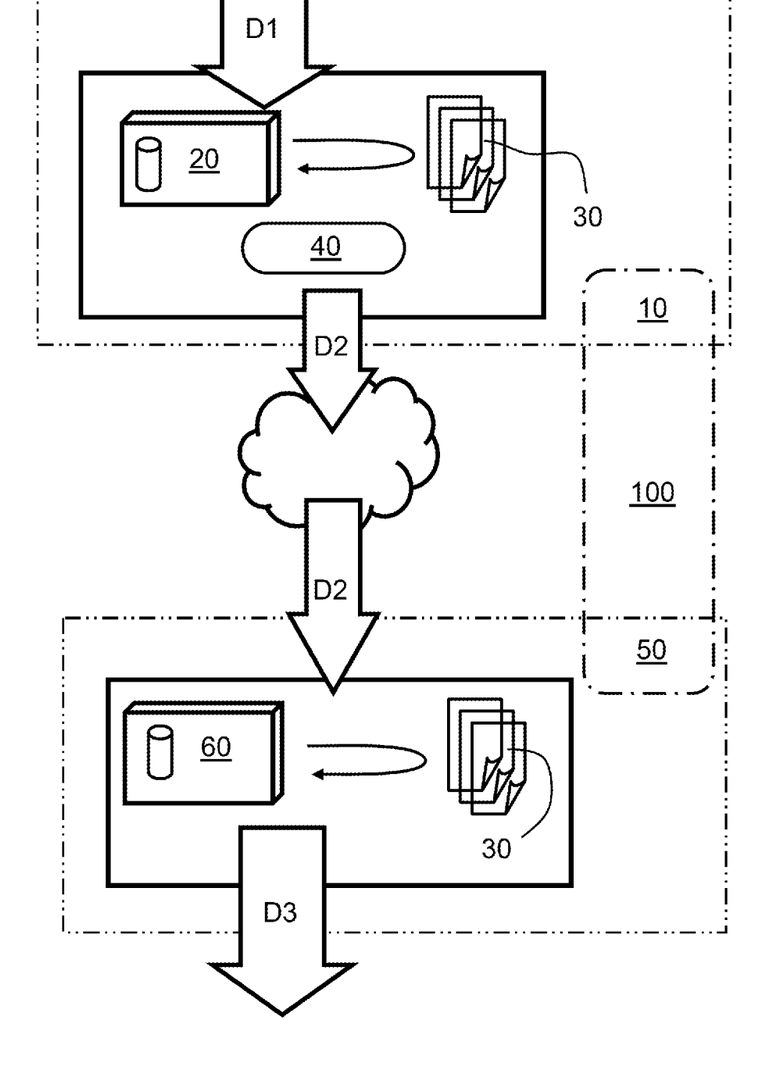
FIG. 1 is an illustration of an encoder and a decoder, collectively a codec, for encoding and correspondingly decoding data, pursuant to the present disclosure.

Referring to FIG. 1, there is provided an illustration of an encoder 10 pursuant to the present disclosure. The encoder 10 is operable to receive data D1 and to process the data D1 to generate corresponding encoded data D2. Beneficially, the encoded data D2 corresponds to a compressed version of at least a portion of the data D1. The encoder 10 includes hard-wired logic and/or computing hardware 20 which is operable to apply an encoding method pursuant to the present disclosure. The encoder 10 receives the data and converts it to corresponding symbols, if the data D1 is not already in a form of symbols. Optionally, the input data D1 is split into a plurality of portions or sections 30 wherein each portion or section 30 is beneficially chosen so that probabilities of occurrence of its symbols are especially efficient for implementing data compression. The sets of symbols are then encoded, for example using aforementioned Continuum Operator, using one or more original or modified symbol codes and/or one or more continuum value symbols, as described in the foregoing to generate intermediate data 40.

The intermediate data 40 is optionally further encoded, for example using Range Coding or similar as described in the foregoing, to generate the encoded data D2.

In a decoder 50 pursuant to the present disclosure, an inverse of computing operations performed in the encoder 10 is beneficially performed to convert the encoded data D2 to decoded data D3, wherein the decoded data D3 is beneficially at least a substantially similar reproduction of the data D1; when the encoder 10 and decoder 50 function in a lossless manner, the data D3 and the data D1 can be mutually identical. The decoder 50 includes hardwired logic and/or computing hardware 60 which is operable to apply a decoding method pursuant to the present disclosure.

The encoder 10 in combination with the decoder 50 constitutes a codec denoted by 100. As aforementioned, the data D1 beneficially corresponds to data representative of real physical variables, for example captured via use of one or more sensors. Such one or more sensors optionally includes at least one of a microphone or camera, of wireless-enabled communication devices, for example a smart phone, tablet computer, phablet, PDA, or similar.

Modifications to embodiments of the invention described in the foregoing are possible without departing from the scope of the invention as defined by the accompanying claims, Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims,

APPENDIX

| Reference | Details |
|---|---|
| [1] | Run-length encoding - Wikipedia, the free encyclopedia (accessed Nov. 28, 2012). URL: http://en.wikipedia.org/wiki/Run-length encoding |
| [2] | Shannon's source coding theorem - Wikipedia, the free encyclopedia (accessed Nov. 28, 2012). URL: http://en.wikipedia.org/wiki/Source coding theorem |
| [3] | Shannon, Claude E. (1948) (accessed Nov. 28, 2012) A Mathematical Theory of Communication. URL: http://cm.bell-labs.com/cm/ms/what/shannonday/shannon1948.pdf |
| [4] | Entropy - Wikipedia, the free encyclopedia (accessed Nov. 28, 2012). URL: http://en.wikipedia.org/wiki/Entropy |
| [5] | Arithmetic coding - Wikipedia, the free encyclopedia (accessed Nov. 28, 2012). URL: http://en.wikipedia.org/wiki/Arithmetic coding |
| [6] | Range encoding - Wikipedia, the free encyclopedia (accessed Apr. 26, 2013). URL: http://en.wikipedia.org/wiki/Range encoding |
| [7] | Variable-length code - Wikipedia, the free encyclopedia (accessed Nov. 28, 2012). URL: http://en.wikipedia.org/wiki/Variable-length code |
| [8] | Delta encoding - Wikipedia, the free encyclopedia (accessed Nov. 28, 2012). URL: http://en.wikipedia.org/wiki/Delta coding |
| [9] | SRLE patent application, GB 1303660.3, U.S. Pat. No. 13/782,872 (allowed) |
| [10] | Run length data compression - United Kingdom Patent 2301252-A (accessed Oct. 1, 2013). URL: http://patent.ipexl.com/GB/GB2301252.html |
| [11] | RGB color model - Wikipedia, the free encyclopedia (accessed Oct. 1, 2013). URL: http://en.wikipedia.org./wiki/RGB color model |
| [12] | YUV - Wikipedia, the free encyclopedia (accessed Oct. 1, 2013). URL: http://en.wikipedia.org/wiki/YUV |
| [13] | EM patent application, GB 1303658.7, U.S. Pat. No. 13/782,757 (allowed) |
| [14] | ODelta Coding patent application, GB 1303661.1, U.S. Pat. No. 13/782,819(allowed) |
| [15] | Table delivery patent application, GB 1403039.9, filed 20 Feb. 2014 |
| [16] | Range Coding patent application, GB 1403038.1, filed 20 Feb. 2014 |

The invention claimed is:

1. An encoder for encoding data provided thereto to generate corresponding encoded data, wherein the encoder comprises a data processing arrangement for applying one or more encoding processes to the data to generate the encoded data, wherein:
   (a) the data processing arrangement is operable to represent the data at least partially in a set of numerical value symbols, if the data is not already expressed in numerical value symbols;
   (b) the data processing arrangement is operable to generate intermediate data in which the numerical value symbols are represented by original values and at least one symbol by a modified value with one or more continuum symbols generated by a continuum operator, wherein the one or more continuum symbols modify preceding symbol values to accommodate an extended range of symbols; and
   (c) the data processing is operable to process the intermediate data to generate the encoded data.

2. The encoder as claimed claim 1, wherein the data processing arrangement is operable to split the data into a plurality of portions or sections, based upon computed probabilities of occurrence of the symbols in the plurality of portions or sections and an efficiency to which they can be compressed.

3. The encoder as claimed in claim 1, wherein generation of the intermediate data by the continuum operator is used for the symbols in the data being transformed via one or more transformations and/or via one or more translation tables.

4. The encoder as claimed in claim 3, wherein the encoded data is provided via a plurality of data streams, and wherein at least one of the streams conveys information indicative of the one or more translation tables and/or one or more transformation methods.

5. The encoder as claimed in claim 4, wherein the information indicative of the one or more translation tables refers to one or more translation tables which are delivered prior to delivering the encoded data and/or are available from an alternative source to the encoder.

6. The encoder as claimed in claim 1, wherein the encoder is operable to process the data including at least one of: captured audio signals, captured video signals, captured images, text data, seismographic data, sensor signals, analog-to-digital (ADC) converted data, biomedical signal data, calendar data, economic data, mathematical data, binary data.

7. The encoder as claimed in claim 1, wherein the data processing arrangement is operable to encode the intermediate data to generate the encoded data by employing at least one of entropy modification, for entropy modification (EM) coding, ODelta coding, RLE, SRLE, Arithmetic Coding, Range Coding, VLC.

8. A method in an encoder of encoding data provided thereto to generate corresponding encoded data, wherein the encoder comprises a data processing arrangement for applying one or more encoding processes to the data to generate the encoded data, the method comprising:
 (a) using the data processing arrangement to represent the data at least partially in a set of numerical value symbols, if the data is not already expressed in numerical value symbols;
 (b) using the data processing arrangement to generate intermediate data in which the numerical value symbols are represented by original values and at least one symbol by a modified value with one or more continuum symbols generated by a continuum operator, wherein the one or more continuum symbols modify preceding symbol values to accommodate an extended range of symbols; and
 (c) using the data processing is operable to process the intermediate data to generate the encoded data.

9. The method as claimed claim 8, the method further comprising using the data processing arrangement to split the data into a plurality of portions or sections, based upon computed probabilities of occurrence of the symbols in the plurality of portions or sections and an efficiency to which they can be compressed.

10. The method as claimed in claim 8, the method further comprising generating of the intermediate data by using the continuum operator for the symbols in the data to transform them via one or more transformations and/or via one or more translation tables.

11. A method as claimed in claim 10, the method further comprising providing the encoded data via a plurality of data streams, wherein at least one of the streams conveys information indicative of the one or more translation tables and/or one or more transformation methods.

12. The method as claimed in claim 11, wherein the information indicative of the one or more translations tables refers to one or more translation tables which are delivered prior to delivering the encoded data and/or are available from an alternative source to the encoder.

13. The method as claimed in claim 8, the method further comprising using the encoder to process the data including at least one of: captured audio signals, captured video signals, captured images, text data, seismographic data, sensor signals, analog-to-digital (ADC) converted data, biomedical signal data, calendar data, economic data, mathematical data, binary data.

14. The method as claimed in claim 8, the method further comprising using the data processing arrangement to encode the intermediate data to generate the encoded data by employing at least one of: entropy modification, for entropy modification (EM) coding, ODelta coding, RLE, SRLE, Arithmetic Coding, Range Coding, VLC.

15. The method as claimed in claim 8, wherein the method is implemented using one or more software products recorded on non-transitory machine-readable data storage media, wherein the one or more software products are executable upon the data processing arrangement of the encoder for implementing the method of encoding the data to generate the encoded data.

16. A decoder for decoding encoded data provided thereto to generate corresponding decoded data, the decoder comprising a data processing arrangement for applying one or more decoding processes to the encoded data to generate the decoded data, wherein:
 (a) the data processing arrangement is operable to process the encoded data to generate intermediate data;
 (b) the data processing arrangement is operable to process the intermediate data to decode the intermediate data, wherein in the intermediate data numerical value symbols are represented by output symbols and at least by one modified output symbol with one or more continuum symbols that are then decoded by an inverse continuum operator, wherein the one or more continuum symbols modify the modified output symbol value to accommodate an extended range of symbols; and
 (c) the data processing arrangement is operable to translate and/or transform the processed intermediate data to represent the decoded data in a set of symbols.

17. The decoder as claimed in claim 16, wherein the data processing arrangement is operable to process the encoded data as a plurality of portions or sections, based upon computed probabilities of occurrence of the symbols in the plurality of portions or sections and an efficiency to which they can be compressed.

18. The decoder as claimed in claim 16, wherein generation of the set of symbols by the continuum operator is implemented by transforming and/or translating values from the decoded data via one or more transformations defined by one or more translation tables and/or one or more transformation methods.

19. The decoder as claimed in claim 18, wherein the encoded data is provided via a plurality of data streams, wherein at least one of the streams conveys information indicative of the one or more translation tables and/or one or more transformation methods.

20. The decoder as claimed in claim 19, wherein the information indicative of the one or more translations tables refers to one or more translation tables which are delivered prior to delivering the encoded data and/or are available from an alternative source to the decoder.

21. The decoder as claimed in claim 16, wherein the decoder is operable to process the encoded data including encoded versions of at least one of: captured audio signals, captured video signals, captured images, text data, seismographic data, sensor signals, analog-to-digital (ADC) converted data, biomedical signal data calendar data, economic data, mathematical data, binary data.

22. The decoder as claimed in claim 16, wherein the data processing arrangement is operable to decode the encoded data to generate the intermediate data by employing an inverse of at least one of: entropy modification, for entropy modification (EM) coding, ODelta coding, RLE, SRLE, Arithmetic Coding, Range Coding, VLC.

23. A method of using a decoder for decoding encoded data provided thereto to generate corresponding decoded data, the decoder further comprising a data processing arrangement for applying one or more decoding processes to the encoded data to generate the decoded data, the method comprising:
 (a) using the data processing arrangement to process the encoded data to generate intermediate data;
 (b) using the data processing arrangement to process the intermediate data to decode the intermediate data, wherein in the intermediate data numerical value symbols are represented by output symbols and at least by one modified output symbol with one or more continuum symbols that are then decoded by an inverse continuum operator, wherein the one or more continuum symbols modify the modified output symbol value to accommodate an extended range of symbols; and (c) using the data processing arrangement to translate and/or transform the processed intermediate data to represent the decoded data in a set of symbols.

24. The method as claimed decoder as claimed in claim 23, the method further comprising using the data processing arrangement to process the encoded data as a plurality of portions or sections, based upon computed probabilities of occurrence of the symbols in the plurality of portions or sections and an efficiency to which they can be compressed.

25. The method as claimed in claim 23, the method further comprising generating the set of symbols by using the continuum operator to transform and/or to translate values from the decoded data via one or more transformations defined by one or more translation tables and/or one or more transformation methods.

26. The method as claimed in claim 25, the method further comprising providing the encoded data via a plurality of data streams, wherein at least one of the streams conveys information indicative of the one or more translation tables and/or one or more transformation methods.

27. The method as claimed in claim 26, wherein the information indicative of the one or more translations tables refers to one or more translation tables which are delivered prior to delivering the encoded data and/or are available from an alternative source to the decoder.

28. The method as claimed in claim 23, the method further comprising using the decoder to process the encoded data including encoded versions of at least one of: captured audio signals, captured video signals, captured images, text data, seismographic data, sensor signals, analog-to-digital (ADC) converted data, biomedical signal data, calendar data, economic data, mathematical data, binary data.

29. The method as claimed in claim 23, the method further comprising using the data processing arrangement to decode the encoded data to generate the intermediate data by employing an inverse of at least one of: entropy modification, for entropy modification (EM) coding, ODelta coding, RLE, SRLE, Arithmetic Coding, Range Coding, VLC.

30. The method as claimed in claim 23, wherein the method is implemented using one or more software products recorded on non-transitory machine-readable data storage media, wherein the one or more software products are executable upon the data processing arrangement of the encoder for implementing the method of decoding the encoded data to generate the decoded data.

31. A codec including a combination of at least one encoder and at least one decoder, wherein the at least one decoder is operable to decode data which is encoded by the encoder
the at least one encoder comprising:
a data processing arrangement for applying one or more encoding processes to the data to generate the encoded data, wherein:
the data processing arrangement is operable to represent the data at least partially in a set of numerical value symbols, if the data is not already expressed in numerical value symbols;
the data processing arrangement is operable to generate intermediate data in which the numerical value symbols are represented by original values and at least one symbol by a modified value with one or more continuum symbols generated by a continuum operator, wherein the one or more continuum symbols modify preceding symbol values to accommodate an extended range of symbols; and
the data processing is operable to process the intermediate data to generate the encoded data;
the at least one decoder comprising:
a data processing arrangement for applying one or more decoding processes to the encoded data to generate the decoded data, wherein:
the data processing arrangement is operable to process be encoded data to generate intermediate data;
the data processing arrangement is operable to process the intermediate data to decode the intermediate data, wherein in the intermediate data numerical value symbols are represented by output symbols and at least by one modified output symbol with one or more continuum symbols that are then decoded by an inverse continuum operator, wherein the one or more continuum symbols modify the modified output symbol value to accommodate an extended range of symbols; and
the data processing arrangement is operable to translate and/or transform the processed intermediate data to represent the decoded data in a set of symbols.

32. An electronic apparatus including at least one encoder and/or at least one decoder, wherein the electronic apparatus is implemented as a part of at least one of: a personal computer, an audio/visual apparatus, a television, a wireless-enabled computing device, a smart phone, a mobile telephone, an interactive games console, an automobile electronic information system,
the at least one encoder comprising:
a data processing arrangement for applying one or more encoding processes to the data to generate the encoded data, wherein:
the data processing arrangement is operable to represent the data at least partially in a set of numerical value symbols, if the data is not already expressed in numerical value symbols;
the data processing arrangement is operable to generate intermediate data in which the numerical value symbols are represented by original values and at least one symbol by a modified value with one or more continuum symbols generated by a continuum operator, wherein the one or more continuum symbols modify preceding symbol values to accommodate an extended range of symbols; and
the data processing is operable to process the intermediate data to generate the encoded data;
the at least one decoder comprising:
a data processing arrangement for applying one or more decoding processes to the encoded data to generate the decoded data, wherein:
the data processing arrangement is operable to process the encoded data to generate intermediate data;
the data processing arrangement is operable to process the intermediate data to decode the intermediate data, wherein in the intermediate data numerical value symbols are represented by output symbols and at least by one modified output symbol with one or more continuum symbols that are then decoded by an inverse continuum operator, wherein the one or more continuum symbols modify the modified output symbol value to accommodate an extended range of symbols; and
the data processing arrangement is operable to translate and/or transform the processed intermediate data to represent the decoded data in a set of symbols.

* * * * *